United States Patent [19]
Cho et al.

[11] Patent Number: 5,514,889
[45] Date of Patent: May 7, 1996

[54] NON-VOLATILE SEMICONDUCTOR MEMORY DEVICE AND METHOD FOR MANUFACTURING THE SAME

[75] Inventors: Myoung-kwan Cho; Jeoug-hyuk Choi, both of Kyungki, Rep. of Korea

[73] Assignee: Samsung Electronics Co., Ltd., Suwon, Rep. of Korea

[21] Appl. No.: 107,901

[22] Filed: Aug. 18, 1993

[30]  Foreign Application Priority Data

Aug. 18, 1993 [KR]  Rep. of Korea ............... 14810/92

[51] Int. Cl.$^6$ .......................................... H01L 29/788
[52] U.S. Cl. ................... 257/316; 257/371; 257/548; 257/324
[58] Field of Search ............................. 257/316, 371, 257/548, 324

[56]   References Cited

U.S. PATENT DOCUMENTS

| | | | |
|---|---|---|---|
| 4,907,058 | 3/1990 | Sakai | 257/371 |
| 5,063,431 | 11/1991 | Ohshima | 257/316 |
| 5,341,342 | 8/1994 | Brahmbhatt | 257/316 |

*Primary Examiner*—Edward Wojciechowicz
*Attorney, Agent, or Firm*—Cushman Darby & Cushman

[57]   ABSTRACT

An EEPROM device in which a high voltage is applied to the chip during the memory cell operation and a method for the manufacturing the same are disclosed. On a P-type semiconductor substrate, a first N-well is formed in a surface portion of the substrate in the cell array region and a second N-well is formed in a first surface of the substrate in the peripheral circuit region. An EEPROM memory cell is formed on the first P-well and a first NMOS transistor is formed on the second P-well. Also, a second NMOS transistor is formed on a second surface portion of the semiconductor substrate in the peripheral circuit 10 region and a PMOS transistor is formed on the second N-well. The impurity concentrations of the first and second P-wells are controlled in accordance with the characteristic of the MOS transistors to be formed. Further, a second NMOS transistor having a resistance against a high voltage is directly formed on the P-type substrate. Thus, the electric characteristic of the EEPROM device is enhanced.

9 Claims, 11 Drawing Sheets

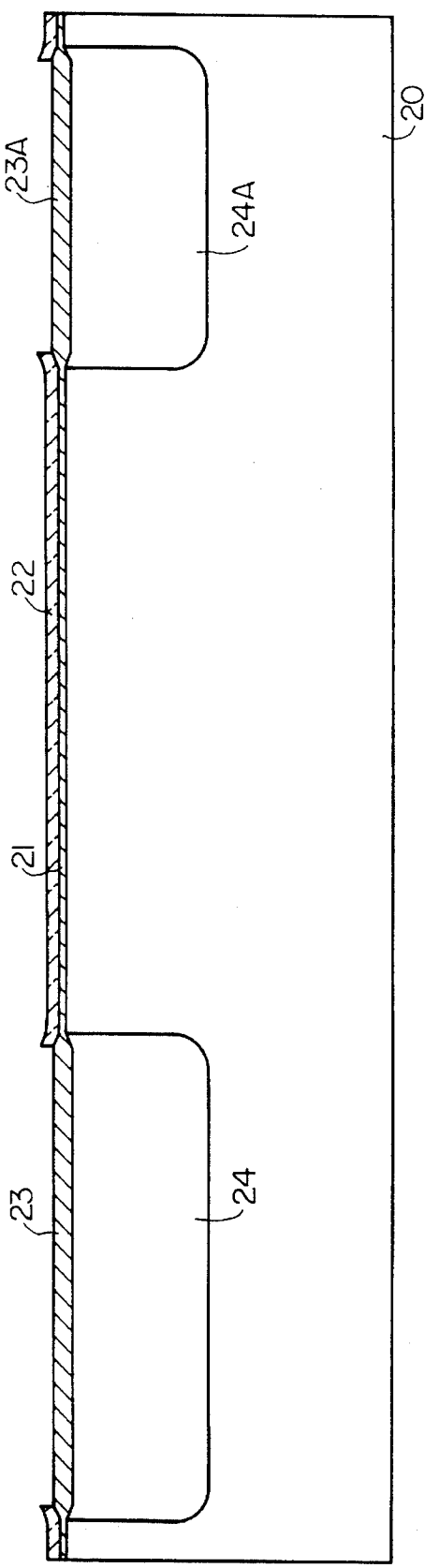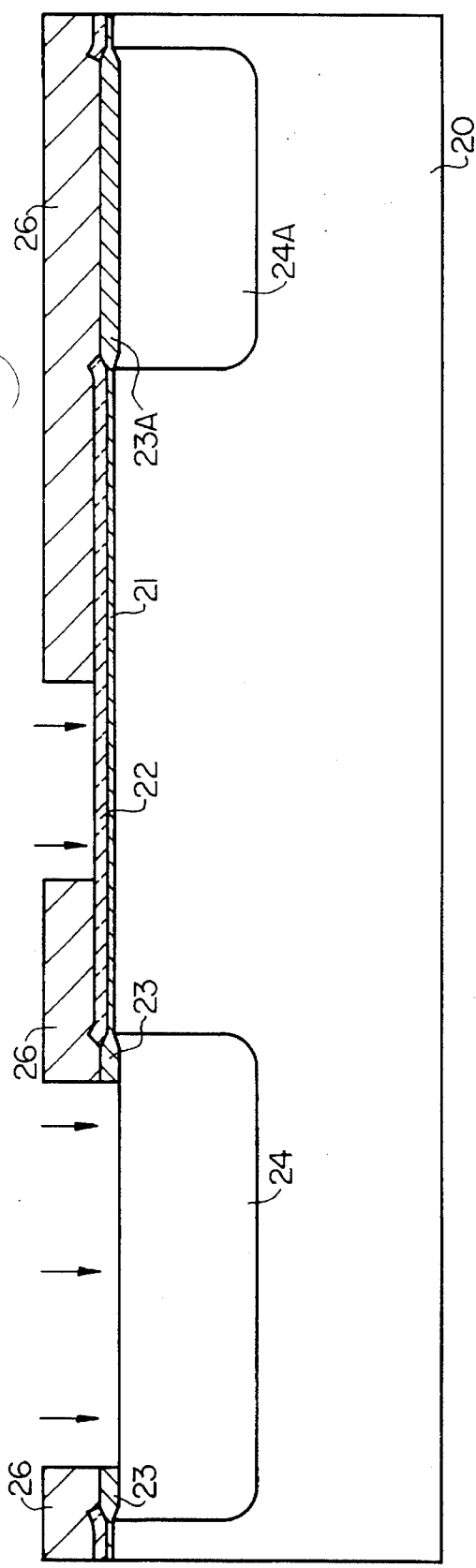

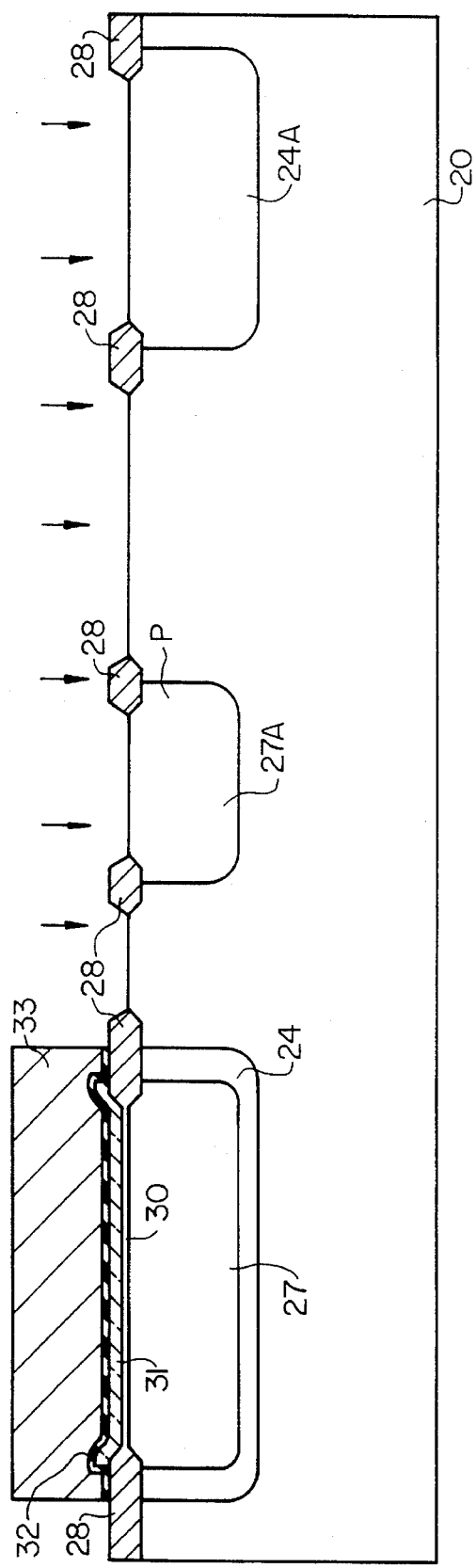
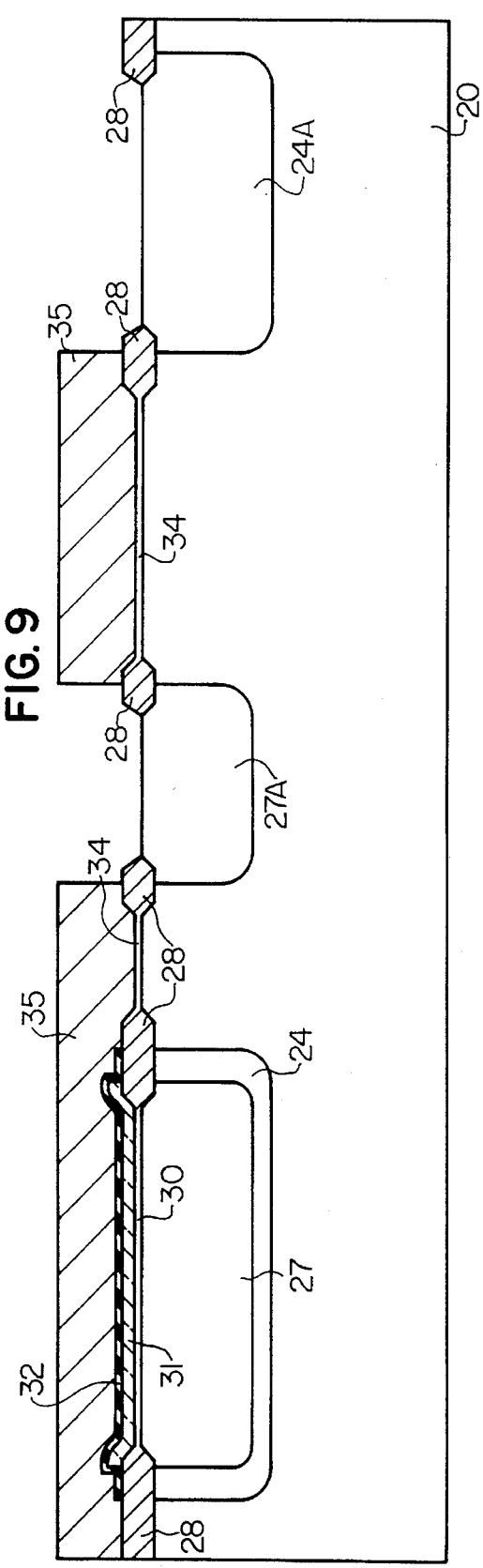

5,514,889

NON-VOLATILE SEMICONDUCTOR MEMORY DEVICE AND METHOD FOR MANUFACTURING THE SAME

BACKGROUND OF THE INVENTION

The present invention relates to an electrically erasable and programmable read only memory (EEPROM) device as a non-volatile semiconductor memory device and a method for manufacturing the same, and, more particularly, to an EEPROM device in which a high voltage is applied to the chip during memory cell operation and a method for the manufacturing the same.

Along with the progress of computer systems, the need for large-capacity non-volatile memories adaptable to high-speed operation, such as memory cards, has increased. Among these non-volatile memories, there has been an increased need for EEPROMs comprised of a floating gate and a control gate and which can electrically erase and program data. Therefore, a variety of cell structures for EEPROMs have been suggested for providing higher integration density, larger capacity and faster performance.

A NAND-structured memory cell has been developed in order to achieve cell area reduction without stressing the fabrication technology. An advanced NAND structured flash EEPROM has been suggested (see "A 2.3 um$^2$ Memory Cell Structure For NAND EEPROMs" by R. Shirota et al. IEDM, 1990, pp 103–106).

FIG. 1 is a sectional view illustrating the above NAND-structured EEPROM which is manufactured as follows. First, a first P-well 2 (in a cell array region) and a second P-well 3 (in a peripheral circuit region) are formed in the upper portion of an N-type semiconductor substrate 1. Then, a cell array comprised of an EEPROM is formed on first P-well 2, an NMOS transistor of the peripheral circuit is formed on a portion of second P-well 3, and an N-well 4 on which a PMOS transistor of the peripheral circuit is to be formed, is formed in a portion of second P-well 3. In order to manufacture the above EEPROM, ions are implanted three times for forming three impurity-doped regions (or bulks): one for forming first P-well 2 on which the cell array is to be formed, one for forming second P-well 3 on which the NMOS transistor of the peripheral circuit is formed, and one for forming N-well 4 on which PMOS transistor of the peripheral circuit is formed.

FIG. 2 shows a portion of an equivalent circuit diagram of an EEPROM device using the aforementioned conventional EEPROM cell and an erase and write (or program) operation. The program operation of a selected cell, is carried out by charging electrons into the floating gate and raising the cell's threshold voltage. This is accomplished by applying 0.3 V to a selected bit line BL(1) of the cell array and 7 V to an unselected bit line BL(2) of the cell array as a program preventing voltage, and applying 10 V to the unselected control gate and 18 V to the selected control gate, respectively. The 18V applied to the selected cell's control gates is coupled so that about 10 V is induced at the floating gate and 0.3 V is transferred to the selected cell's channel. Then, a nearly 10 MeV field applied between the opposite sides of a nearly 100 Å-thick tunnel oxide layer which exists between the channel and floating gate, causes the floating gate electrode to be charged with electrons by the Fowler-Nordheim (F-N) tunnelling effect. Thus, a datum is written into the selected memory cell.

Conversely, the erase operation, which is carried out by discharging the electrons within the floating gate electrode to thereby lower the threshold voltage of the cell, is accomplished by applying 20 V to the P-well 2 on which the cell array is formed, opening the bit-line and source-line, and grounding the control gate. Thereby, the electrons within the floating gate are discharged by the field between the ends of the tunnel oxide layer. Here, in order to protect the transistor of the peripheral circuit which operates at +5 V (Vcc) from the approximately 20 V applied to the P-well 2 of the cell array during the erase operation, transistors are formed on another P-well 3 which is electrically isolated and independent of the P-well 2 of the cell array.

A read operation is performed according to the data determination. The data is determined by the bit-line current path fluctuating between "on" and "off" states according to the positive or negative value of the threshold voltage of the selected cells.

For manufacturing the above conventional NAND EEPROM device, a photolithography process for forming the well structures is performed twice: First, that is, for forming a first P-well 2 on which a cell array is to be formed and a second P-well 3 on which the NMOS transistor of the peripheral circuit is to be formed; Second for forming an N-well 4 which is located within the second P-well 3, on which the PMOS transistor of the peripheral circuit is to be formed on the N-type semiconductor substrate 1.

However, the conventional NAND EEPROM device as described above exhibits certain drawbacks. First, since the N-type substrate 1 is applied with a high voltage concurrently with the erase operation which applies 20 V to the P-well 2 on which the cell array exists, transistors cannot be formed directly on the N-type substrate 1. Also, since the transistors of the peripheral circuit are formed on a P-well 3 and an N-well 4 within this P-well 3, the bulk resistance is increased. Accordingly, latchup and other delitorious electrical characteristics occur.

SUMMARY OF THE INVENTION

For solving the above-mentioned problems, an object of the present invention is to provide a non-volatile memory device which can be manufactured by independently controlling the bulk regions used in the cell array and peripheral circuit regions thereof.

Another object of the present invention is to provide a suitable method for manufacturing a non-volatile memory device.

To accomplish the aforementioned objects, the present invention provides a semiconductor memory device comprising: a semiconductor substrate of a first conductivity type which is divided into a cell array region and a peripheral circuit region; a first impurity-doped region of the first conductivity type formed in the surface portion of the semiconductor substrate in the cell array region; a second impurity-doped region of a second conductivity type formed in the surface portion of the semiconductor substrate in the cell array region, the second impurity-doped region enclosing the first impurity-doped region; and a memory cell comprised of a fourth source region and a fourth drain region formed on the surface portion of the first impurity-doped region and of a floating electrode formed on the first impurity-doped region and a control electrode formed on the floating electrode. In the peripheral circuit region, the semiconductor memory device may further comprise a third impurity-doped region of the first conductivity type formed in a first surface portion of the semiconductor substrate in the peripheral circuit region; a first MOS transistor comprised of a first gate electrode formed on the third impurity-doped region and first source and drain regions formed in surface portions of the third impurity-doped region; a second MOS transistor comprised of second source and drain regions formed in a second surface portion of the semiconductor substrate in the peripheral circuit region and a second gate electrode formed on the semiconductor substrate; a fourth impurity-doped region of the second conductivity type formed in a third surface portion of the semiconductor substrate in the peripheral circuit region; a third MOS transistor comprised of third source and drain regions formed in surface portions of the fourth impurity-doped region and a third gate electrode formed on the fourth impurity-doped region.

In order to achieve another object, the present invention provides a method for manufacturing a semiconductor memory device comprising the steps of: providing a semiconductor substrate of a first conductivity type defined into a cell array region and a peripheral circuit region; forming a second impurity-doped region of a second conductivity type in a surface portion of the semiconductor substrate in the cell array region; forming a first impurity-doped region of the first conductivity type enclosed by the first impurity-doped region; and forming a memory device on the first impurity-doped region. The memory device is formed by forming a first conductive layer pattern on the first impurity-doped region, forming an insulating layer pattern covering the first conductive layer pattern, forming a second conductive layer pattern on the insulating pattern, patterning the second conductive layer pattern, the insulating layer pattern and the first conductive layer pattern sequentially, to thereby form a control gate electrode and a floating gate electrode, and implanting an impurity into the first impurity-doped region to thereby form a source region and a drain region of the memory device.

In accordance with one embodiment of the present invention, in the peripheral circuit region, a third impurity-doped region of the first conductivity type in a first surface portion of the semiconductor substrate in the peripheral circuit region may be formed, and a fourth impurity-doped region of the second conductivity type in a third surface portion of the semiconductor substrate in the peripheral circuit may be formed.

The second and fourth impurity-doped regions are preferably formed by forming a first oxide layer on the semiconductor substrate, forming an antioxidative layer on the first oxide layer, forming a photoresist pattern on the anti-oxidative layer which exposes portions of the anti-oxidative layer where the second and fourth impurity-doped regions are to be formed etching the exposed portions of the anti-oxidative layer, and implanting a second conductivity type impurity into surface portions of the semiconductor substrate via the etched portion of the anti-oxidative layer.

The first and third impurity-doped regions may be formed by forming a first oxide layer and an anti-oxidative layer on the semiconductor substrate excluding a portion where the second impurity-doped region is formed, forming a second oxide layer on the second impurity-doped region, forming a photoresist pattern exposing a portion of the second oxide layer where the first impurity-doped region is to be formed and a portion of the anti-oxidative layer where the third impurity-doped region is to be formed, and then implanting a first conductivity type impurity into the semiconductor substrate.

According to one embodiment of the present invention, the first conductivity type impurity is firstly implanted at a first acceleration energy such that the first conductivity type impurity penetrates the second oxide layer and the anti-oxidative layer, and secondly implanted at a second acceleration energy such that the first conductivity type impurity penetrates the anti-oxidative layer but not the second oxide layer.

According to another embodiment of the present invention, the second oxide layer is etched using the photoresist pattern as an etching mask to thereby expose a surface portion of the semiconductor substrate where the first impurity-doped region is to be formed. The first conductivity type impurity is firstly implanted at a first acceleration energy such that the first conductivity type impurity does not penetrate the anti-oxidative layer, and secondly implanted at a second acceleration energy such that the first conductivity type impurity penetrates the anti-oxidative layer.

According to still another embodiment of the present invention, the first conductivity type impurity is firstly implanted at a first acceleration energy such that the first conductivity type impurity penetrates the anti-oxidative layer but not the second oxide layer, the second oxide layer is etched using the photoresist pattern as an etching mask to thereby expose a surface portion of the semiconductor substrate where the first impurity-doped region is to be formed, and then the first conductivity type impurity is secondly implanted at a second acceleration energy such that the first conductivity type impurity penetrates the anti-oxidative layer.

The NAND-structured EEPROM according to the present invention comprises EEPROM cells formed on the pocket P-well. The impurity concentration of the pocket P-well may be controlled independently from the P-well which is formed in the peripheral circuit region. Therefore, an EEPROM device having two P-wells in the cell array region and the peripheral circuit region, respectively, of which the concentrations may controlled according to the device characteristic and independently from each other, may be obtained.

Also, an NMOS transistor of the peripheral circuit region which is operated at a high voltage may be formed directly on the P-type semiconductor substrate, thus enhancing the resistance thereof against the high voltage. In the meantime, the characteristics of the NMOS transistor of the peripheral circuit region which is operated at Vcc, are controlled by forming the NMOS transistor on the P-well of the peripheral circuit region to thereby enhance the punch-through characteristics thereof.

BRIEF DESCRIPTION OF THE DRAWINGS

The above object and other advantages of the present invention will become more apparent by describing in detail a preferred embodiment thereof with reference to the attached drawings in which:

FIGS. 4 through 12 are sectional views illustrating a method for manufacturing a NAND-structured EEPROM device according to a first embodiment of the present invention;

DESCRIPTION OF THE PREFERRED EMBODIMENT

Hereinafter, the present invention is to be described in more detail in reference with the attached drawings.

Figure 1:
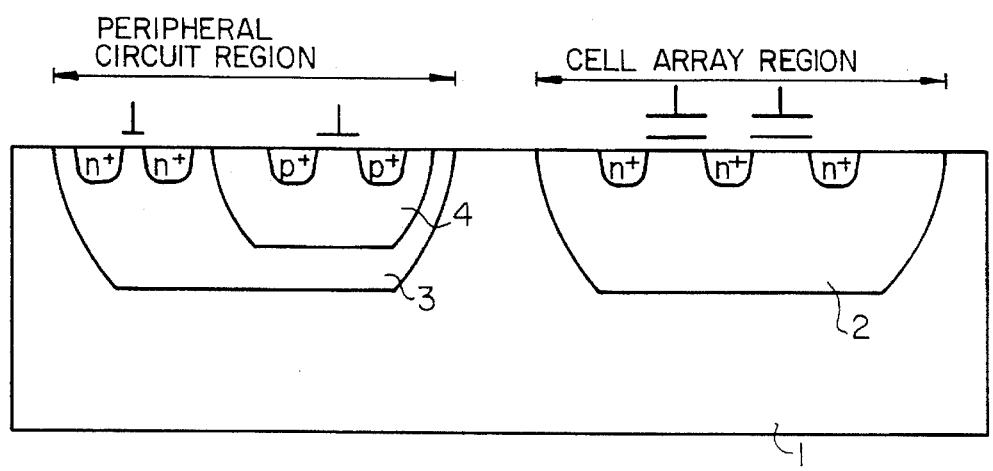
FIG. 1 is a sectional view showing the conventional NAND-structured EEPROM.
Figure 2:
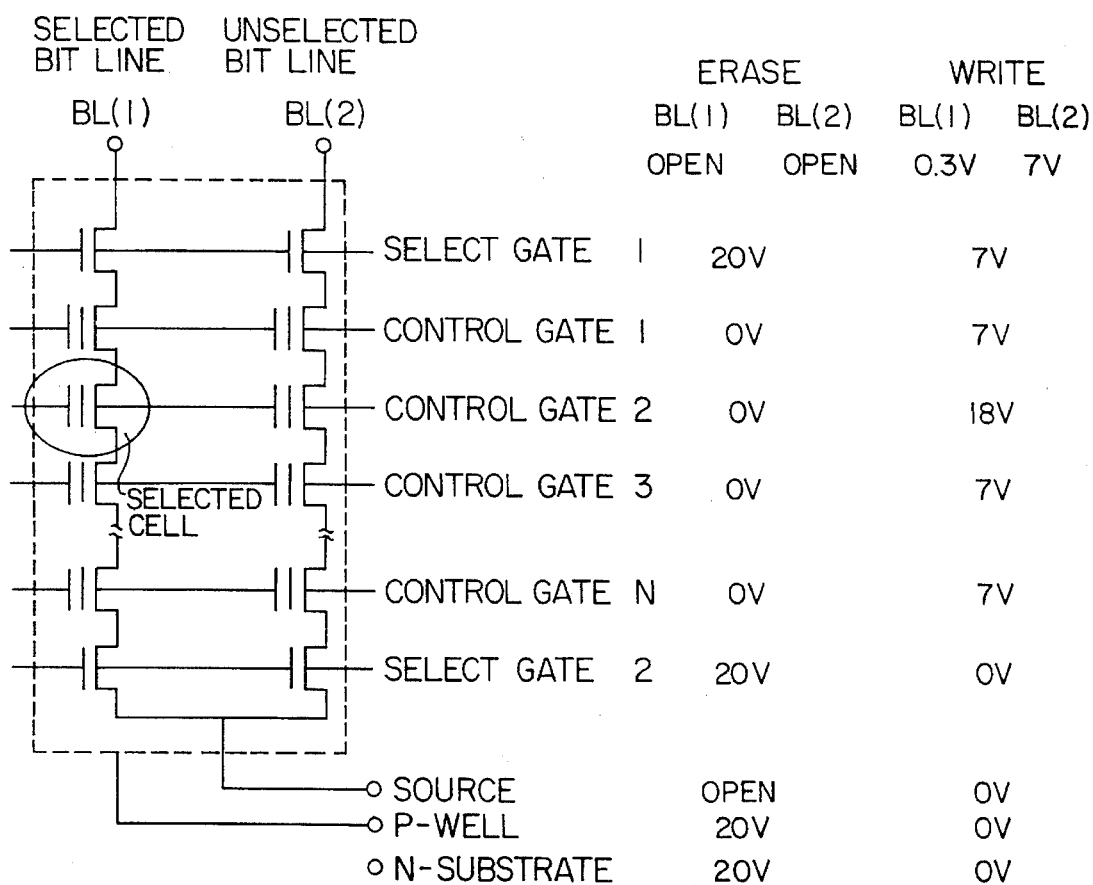
FIG. 2 shows a portion of an equivalent circuit diagram of an EEPROM device using a conventional NAND-structured EEPROM cell and an erase and write (or program) operation thereof.
Figure 3:
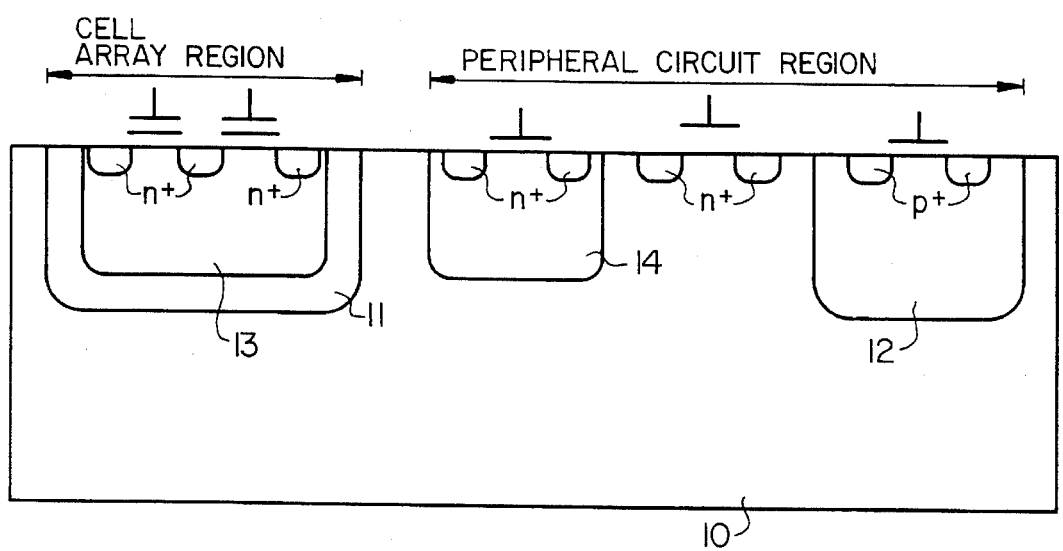
FIG. 3 is a sectional view showing a structure of a NAND-structured EEPROM according to one embodiment of the present invention.

FIG. 3 is a sectional view of a NAND-structured EEPROM device according to one embodiment of the present invention.

Into a semiconductor substrate of a first conductivity type (having a low concentration), e.g., P-type semiconductor substrate 10, a second conductivity type impurity (an ion) is implanted to thereby form a plurality of second conductivity type impurity-doped regions, i.e., N-wells. These N-wells include a first N-well 11 as a second impurity-doped region (of a second conductivity type) formed in the cell array region and a second N-well 12 as a fourth impurity-doped region (of a second conductivity type) in a third surface portion of the semiconductor substrate in the peripheral circuit region.

A first conductivity type impurity is implanted into a first N-well 11 of the cell array region, to thereby form a first P-well 13 as a first impurity-doped region of a first conductivity type in the cell array region. On first P-well 13, an EEPROM device having source and drain regions (formed in the surface portions of first P-well 13) and a floating gate formed on the first P-well 13 and a control gate formed on the floating electrode, is formed. Since first N-well 11 encloses first P-well 13, the first P-well 13 is generally referred to as a pocket P-well.

In the peripheral circuit region (having no cell and including second N-well 12) of P-type semiconductor substrate 10, for operating the cell array, a second P-well 14 as a third impurity-doped region of a first conductivity type is formed in a first surface portion of semiconductor substrate 10 by implanting an impurity having a first conductivity type (the same conductivity type as that of semiconductor substrate 10) into a first portion of the peripheral circuit region of semiconductor substrate 10, while excluding the portion where second N-well 12 is formed.

On second P-well 14, a first MOS transistor (that is, first NMOS transistor) is formed which comprises first source and drain regions formed in surface portions of second P-well 14, and a first gate electrode formed on second P-well 14.

In a second portion of the peripheral circuit region of P-type semiconductor substrate 10 (excluding the portions where second N-well 12 and second P-well 14 are formed), a second MOS transistor (second NMOS transistor) which has a resistance against high voltage is formed between second P-well 14 and second N-well 12. The second MOS transistor includes second source and drain regions formed in second surface portions of semiconductor substrate 10 and a second gate electrode formed on semiconductor substrate 10.

On second N-well 12, a third MOS transistor (PMOS transistor) having third source and drain regions in surface portions of second N-well 12 and a third gate electrode on second N-well 12, are formed.

Since the second NMOS transistor is formed directly on the P-type semiconductor substrate 10, the reverse bias characteristic between the N+ doped region of the NMOS transistor and the P-type semiconductor substrate 10 having a low impurity concentration is improved. The second NMOS transistor has a gate insulating layer whose thickness is thicker than that of first NMOS transistor. Also, using a P-type semiconductor substrate 10 having a low impurity concentration improves the body effect. An NMOS transistor of the peripheral circuit, which does not have a resistance essentially against a high voltage, is formed on second P-well 14, thus improving the punch-through characteristic of the short channel.

The characteristic of second N-well 12 on which a PMOS transistor of the peripheral circuit is formed should be controlled according to the PMOS characteristic and the isolation characteristics thereof. Since second N-well 12 is formed simultaneously with the first N-well 11 wherein first P-well 13 (the pocket P-well) is to be formed, the change in the characteristics of second N-well 12 should accompany the characteristic change in first N-well 11. This in turn causes the characteristic of first P-well 13 to change. When simultaneously forming first P-well 13 and second P-well 14 by using the same photomask and the same ion-implantation processes, in order to optimize first P-well 13 according to the change in the characteristic of first N-well 11, the characteristic of second P-well 14 is undesirably changed. To solve this problem, a photolithography process should be added for forming first P-well 13 and second P-well 14 separately, which is undesirable.

In the present invention, a method for manufacturing the above EEPROM device without an additional photolithography process is provided. Hereinafter, the method will be described in detail with reference to the following embodiments.

Embodiment 1

FIGS. 4 through 12 are sectional views illustrating a method for manufacturing a NAND-structured EEPROM device according to a first embodiment of the present invention.

FIG. 4 is a sectional view illustrating a step of forming a first N-well 24 as a second impurity-doped region and a second N-well 24A as a fourth impurity-doped region in an upper surface portion of P-type semiconductor substrate 20. More particularly, on a first conductivity type semiconductor substrate, for example, <100>-oriented P-type semiconductor substrate 20 having a resistance of 18Ω.cm, a first oxide layer 21 is firstly formed to a thickness of 380 Å, as in the conventional N-well formation. Thereafter, on first oxide layer 21, a silicon nitride layer 22 as an anti-oxidative layer is formed by depositing silicon nitride to a thickness of about 2000 Å via a conventional chemical vapor deposition (CVD) method. Thereafter, a photoresist is coated on the silicon nitride layer 22 to thereby form a photoresist film (not shown). Then, the photoresist film is exposed using a photomask for forming first and second N-well 24 and 24A and developed to form a first photoresist pattern (not shown) which exposes a portion of silicon nitride layer 22. Using the first photoresist pattern as an etching mask, a predetermined portion of silicon nitride layer 22 is etched, to thereby expose surface portions of semiconductor substrate 20 where first N-well 24 of the cell array region and second N-well 24A of the peripheral circuit region are to be formed. Then, a second conductivity type impurity (N-type impurity) such as phosphor (P) is ion-implanted at a dosage of $1.7 \times 10^{13}$ atoms/cm$^2$ and at an acceleration voltage of 150 KeV, and then the first photoresist pattern is removed. Next, the substrate is heat-treated at a temperature of about 1150° C. for seventeen hours, to thereby not only activate the doped N-type impurity, but also diffuse the doped impurity into semiconductor substrate 20. As a result, first N-well 24 of the cell array region and second N-well 24A of the peripheral circuit region are formed.

Here, during the heat-treatment, second oxide layers 23 and 23A of the respective cell array region and peripheral circuit region are grown to a thickness of 4,500 Å where the portions of silicon nitride layer 22 have been etched.

FIG. 5 is a sectional view for illustrating a step of forming a second photoresist pattern 26 for forming a first P-well as a first impurity-doped region and a second P-well as a third impurity-doped region, and then firstly implanting a first conductivity type impurity. After the step of FIG. 4, a second photoresist is coated on the resultant, thereby forming a second photoresist film. The second photoresist film is exposed using a photomask for forming the first and second P-wells and then developed to thereby form a second photoresist pattern for forming the first and second P-wells which expose a portion (excluding the edge portion) of second oxide layer 23 of the cell array region and a portion of silicon nitride layer 22 where second P-well is to be formed. Then, a portion (excluding the surrounding edge portions) of second oxide layer 23 of the cell array region which is formed on first N-well 24 is wet-etched using an oxide etchant, to thereby expose the surface portion of semiconductor substrate 20 where first N-well 24 has been formed. At this time, since silicon nitride layer 22 has a low etching selectivity with respect to the oxide etchant used in the above wet-etching when compared to the second oxide layer 23, the exposed portion of silicon nitride layer 25 is not etched away. Thereafter, a first conductivity type impurity (a P-type impurity such as boron) is firstly ion-implanted at a dosage of $0.9 \times 10^{13}$ atoms/cm$^2$ and at a low acceleration voltage of 50 KeV for forming the pocket P-well of the cell array region. Under the above conditions, the exposed portion of silicon nitride layer 22 prevents the impurity from doping into the substrate. Thus, only a portion of first N-well 24 is doped with P-type impurities via the exposed surface portion of semiconductor substrate 20.

Figure 6:
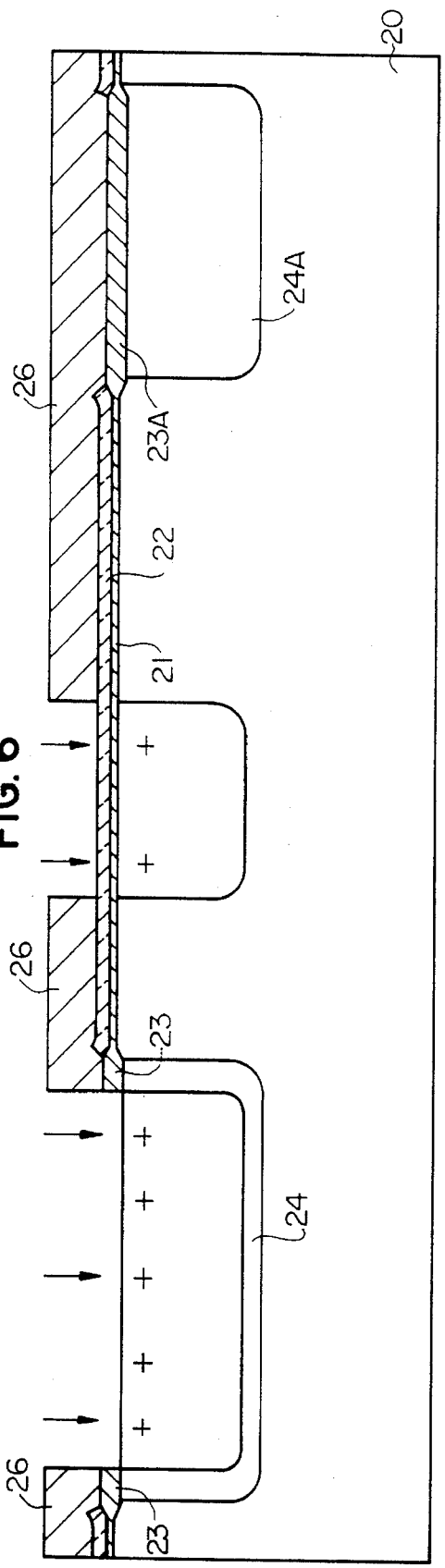

FIG. 6 is a sectional view illustrating a step of secondly implanting a first conductivity type impurity to thereby form a first P-well 27 and a second P-well 27A. After firstly implanting the first conductivity type impurity at a low energy, in order to form second P-well 27A of the peripheral circuit region, the same impurity as that firstly implanted is implanted at a dose of $1.5 \times 10^{13}$ atoms/cm$^2$ at an acceleration voltage of 130 KeV (by which boron can penetrate silicon nitride layer 22 having a thickness of about 2,000 Å), without removing second photoresist pattern 26. After removing second photoresist pattern 26, a drive-in step is performed at a temperature of 1,150° C. for eight hours, to complete first (pocket) P-well 27 (as a first impurity-doped region) of the cell array area and second P-well 27A (as a third impurity-doped region) of the peripheral circuit region. Second P-well 27A is formed in a first surface portion of semiconductor substrate 20 in the peripheral circuit region.

Figure 7:
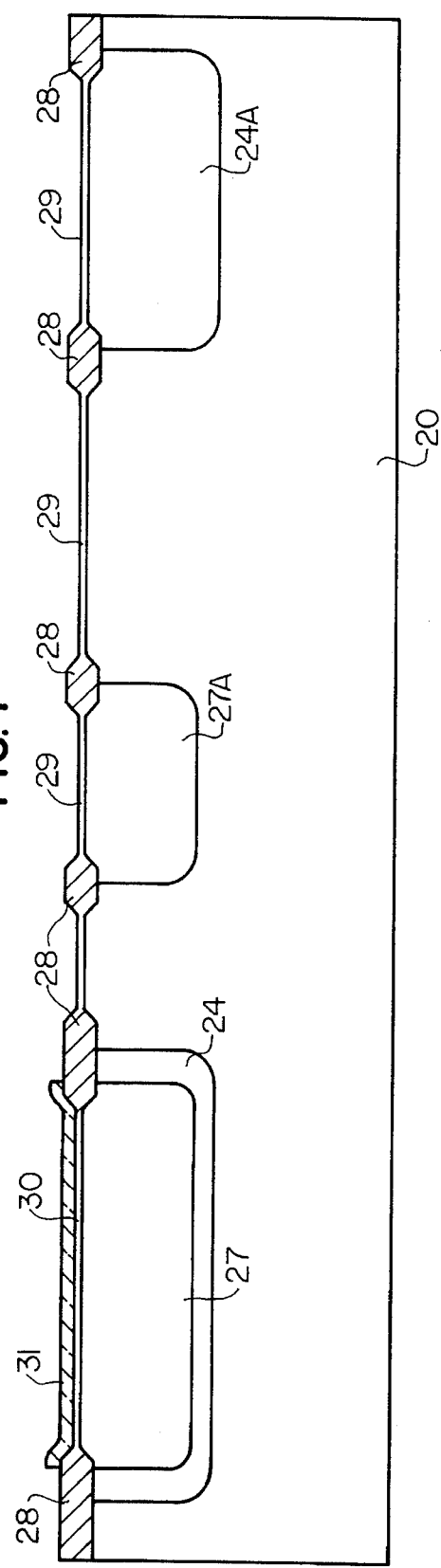

FIG. 7 is a sectional view illustrating a step of forming a plurality of field oxide layers 28, a first gate oxide layer 29 of the peripheral circuit region, a tunnel oxide layer 30 of the cell array region, and first polysilicon layer pattern 31 for forming floating electrode of a NAND-structured EEPROM cell of the cell array. More particularly, after the drive-in step of FIG. 6, silicon nitride layer 22, the 20 remaining second oxide layers 23 and 23A, and first oxide layer 21 are removed. Then, via a conventional LOCOS process, a plurality of field oxide layer 28 for electrically isolating devices are formed on semiconductor substrate 20, and then a first gate oxide layer 29 is formed to a thickness of 200 Å on the whole surface portion of semiconductor substrate 20 excluding the portions where field oxide layers 28 have been formed. Next, in order to selectively form tunnel oxide layer 30 in the cell array region which is thinner than first gate oxide layer 29, a portion of first gate oxide layer 29 in the cell array region is removed via a conventional photolithography process. After removing the photoresist pattern used in the photolithography process, a tunnel oxide layer 30 is formed to a thickness of 100 Å on first P-well of cell array region. Thereafter, for forming a first conductive layer for forming a floating gate of an EEPROM device, a first polysilicon is deposited to a thickness of 1,500 Å, to thereby form a first polysilicon layer. The first polysilicon layer is doped with phosphorous ions so as to have a sheet resistance of 100Ω/□, thereby forming a first conductive layer for forming the floating gate. Then, the first conductive layer is patterned by a conventional photolithography process, to thereby form a first conductive layer pattern 31 on the cell array region.

FIG. 8 is a sectional view illustrating an insulating layer pattern 32 covering first conductive layer pattern 31 and implanting an impurity for controlling the threshold voltage of the peripheral circuit region. After the step of FIG. 7, an oxide/nitride/oxide (ONO) layer is formed to a thickness of 160 Å/200 Å/30 Å as an insulating layer on the whole surface of the resultant. Thereafter, a third photoresist pattern 33 is formed which covers the cell array region and exposes the peripheral circuit region. Using third photoresist pattern as an etching mask, the ONO film is etched to thereby form insulating layer pattern 32 covering first conductive layer pattern 31. At this time, first gate oxide layer 29 which is formed on the peripheral circuit region, is simultaneously removed, to thereby expose the surface of semiconductor substrate 20 of the peripheral circuit region.

Thereafter, in order to control the threshold voltage of peripheral circuit region, while leaving third photoresist pattern 33, a first conductivity type (P-type) impurity, such as boron, is ion-implanted through the exposed surface of semi-conductor substrate 20 at a dosage of $2.0 \times 10^{11}$ atoms/cm$^2$ and at an acceleration voltage of 50 KeV, and then third photoresist pattern 33 is removed.

Thereafter, an ion-implantation process is performed for differentiating the threshold of the NMOS transistors of the peripheral circuit. More particularly, a region where an NMOS transistor of the peripheral circuit is to be formed, i.e., second P-well 27A, is exposed by forming a fourth photoresist pattern (not shown) and then, a first conductivity type (P-type) impurity, such as boron, is ion-implanted through the exposed region at a dosage of $6.0 \times 10^{11}$ atoms/cm$^2$ and at an acceleration voltage of 50 KeV. Thereafter, the fourth photoresist pattern is removed.

Then, in order to form a normally on (operable) NMOS transistor of the peripheral circuit directly on semiconductor substrate 20 (but not on second N-well 24A nor second P-well 27A), a fifth photoresist pattern (not shown) is formed to expose a portion of semiconductor substrate 20 between second P-well 27A and second N-well 24A in the peripheral circuit section. Through the exposed portion, a second conductivity type (N-type) impurity such as arsenic (As) is ion-implanted at a dosage of $2.2 \times 10^{12}$ atoms/cm$^2$ and at an acceleration voltage of 30 KeV. Next, the fifth photoresist pattern is removed.

FIG. 9 is a sectional view illustrating a step of forming a second gate oxide layer 34 and partially removing second gate oxide layer 34 on second N-well 24A and second P-well 27A. After removing the fifth photoresist pattern, second gate oxide layer 34 is grown to a thickness of 200 Å via a thermal oxidation, on the whole surface of the resultant excluding the cell array region where insulating layer pattern 32 covers. Thereafter, a photoresist is coated on the resultant to form a photoresist film, which is exposed using a photomask and then developed to form a sixth photoresist pattern 35 exposing a portion of second gate oxide layer 34 formed on both second N-well 24A and second P-well 27A. Using sixth photoresist pattern 35 as an etching mask, the exposed portion (which is formed in the peripheral circuit region excluding the region where a PMOS transistor and an NMOS transistor having a resistance against a high voltage are to be formed) of second gate oxide layer 34 on second P-well 27A and second N-well 24A, is partially removed via a conventional etching method.

Figure 10:
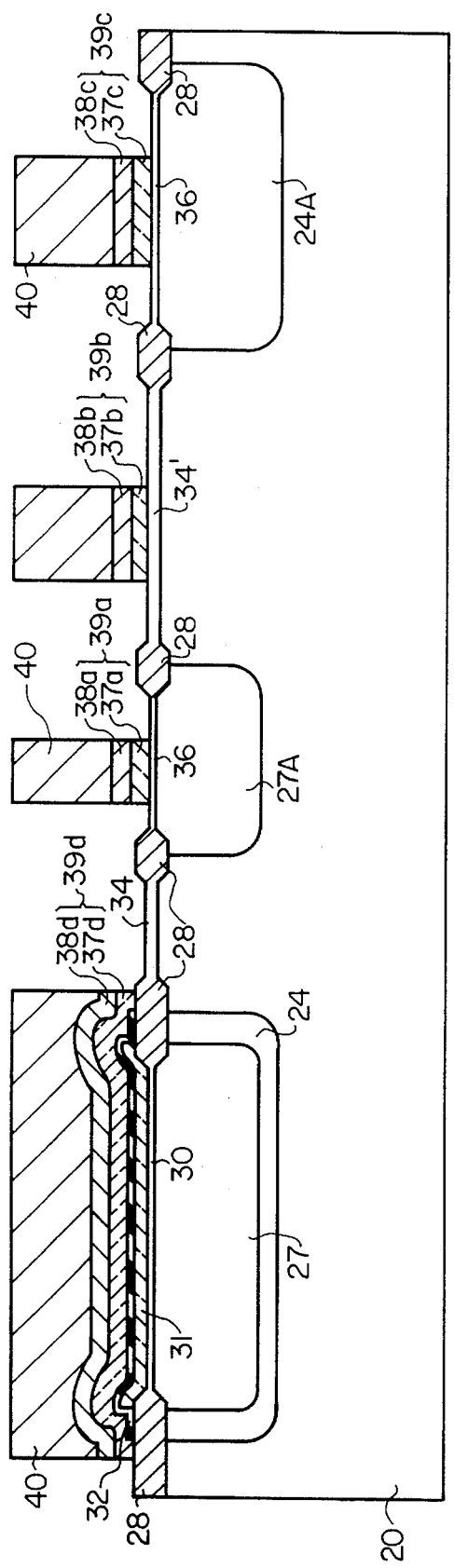

FIG. 10 is a sectional view illustrating a step of forming a third gate oxide layer 36 and forming gate electrodes 39a, 39b and 39c of the transistors of the peripheral circuit and a composite conductive pattern 39b for forming control gate electrodes of the cell array EEPROMs. After removing sixth photoresist pattern 35, on the surface region of second P-well 27A and second N-well 24A (where second gate oxide layer 34 has been etched), third gate oxide layer 36 is grown to have a thickness of about 180 Å, via a conventional thermal oxidation process. During the thermal oxidation for forming third gate oxide layer 36, second gate oxide layer 34 (which is formed between second P-well 27A and second N-well 24A and has not 5 been etched in the above step of FIG. 9) grows to a greater thickness than its original thickness of 200 Å. Reference numeral 34' represents the additionally grown second gate oxide layer.

Thereafter, on whole surface of the resultant, as a second conductive layer for forming the control gate electrodes of the cell array and the gate electrodes of the transistor of the peripheral circuit, a second polysilicon is deposited to form a second polysilicon layer having a thickness of about 1,500 Å, and then phosphorous is doped so that the second polysilicon layer has a sheet resistance of 100Ω/□. Then, on the second polysilicon layer, a refractory metal silicide layer is formed by depositing a refractory metal silicide (such as WSi) to a thickness of 1,500 Å. Thereafter, the composite conductive layer consisting of the second polysilicon layer and the refractory metal silicide layer is patterned via a photolithography process using a seventh photoresist pattern 40. Thus, first, second and third gate electrodes 39a, 39b and 39c of first, second and third MOS transistors of the peripheral circuit consisting of first, second and third patterns 37a, 37b and 37c of second polysilicon layer pattern and first, second and third refractory metal silicide layer pattern 38a, 38b and 38c are formed. Also, a composite pattern 39d for forming control gate electrode of the cell array (which covers insulating layer pattern 32) consisting of a fourth second polysilicon layer pattern 37d and fourth refractory metal silicide layer pattern 38d, is formed.

According to the above method, since the NMOS transistor's gate formed directly on P-type semiconductor substrate 20 which operates at a high voltage of about 20 V during the cell program/erase operation, has the thickly grown second gate oxide layer 34' as a gate oxide layer, its resistance against high voltage is improved. In the meantime, the NMOS transistor formed on second P-well 27A which operates at Vcc (which is a low voltage) uses third gate oxide layer 36 as a gate insulating layer (which is relatively thin when compared to that of the NMOS transistor formed directly on semiconductor substrate 20). Therefore, the punch-through characteristic the NMOS transistor is improved.

Figure 11:
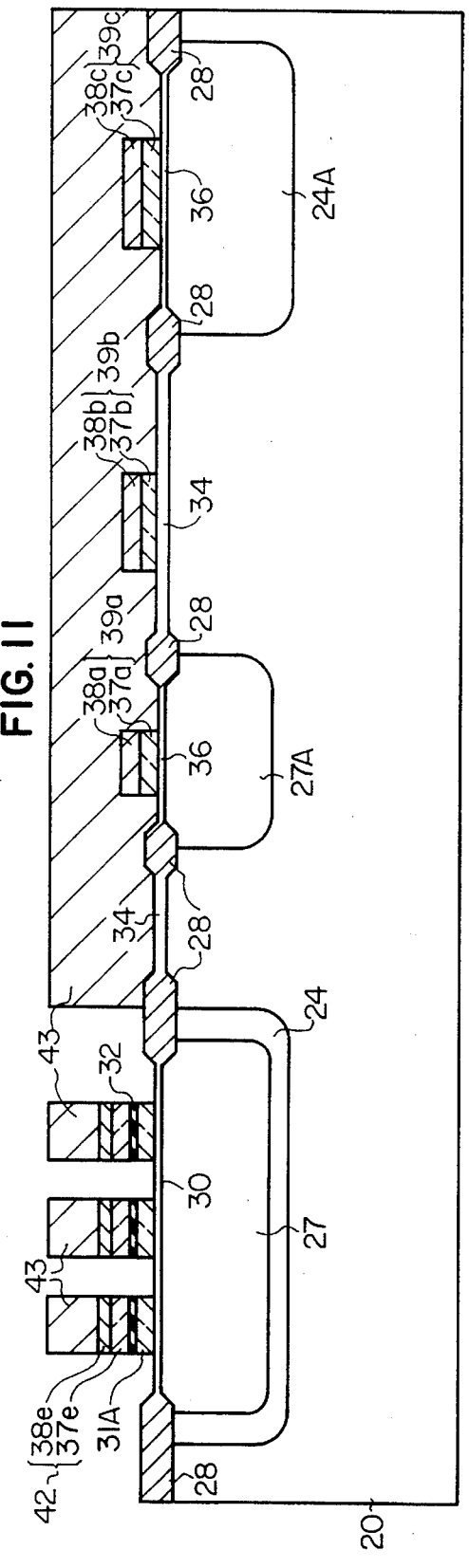

FIG. 11 is a sectional view illustrating a step of forming a control gate electrode 42 and a floating gate electrode 31A of the cell array. After removing sixth photoresist pattern 40 in FIG. 10, a seventh photoresist pattern 43 for forming the control and floating electrode of an EEPROM which covers the peripheral circuit region is formed on the resultant. Using seventh photoresist pattern 43 as an etching mask, fourth refractory metal silicide layer pattern 38d, second polysilicon layer pattern 37d, insulating layer pattern 32 and first polysilicon layer pattern 31 are sequentially etched to thereby form the floating gate electrode 31A and control gate electrode 42 (consisting of a fifth second polysilicon layer pattern 37e and a fifth refractory metal silicide layer pattern 38e) of the cell array.

Figure 12:
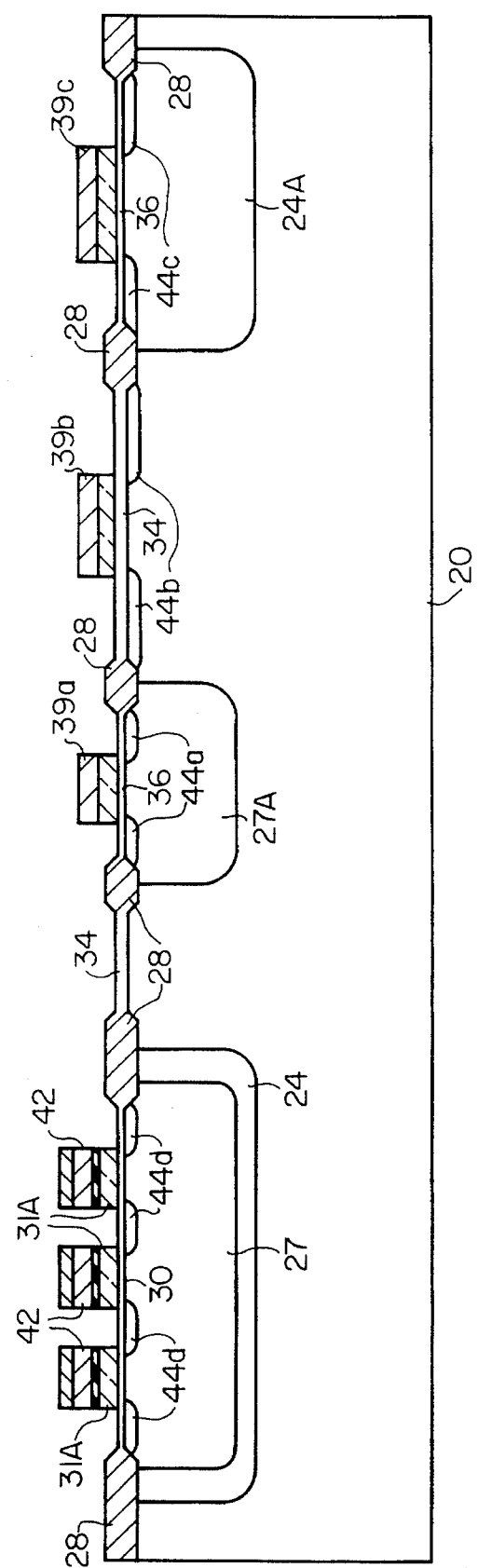

FIG. 12 is a sectional view illustrating a step of completing the EEPROM cells and first, second and third MOS transistors of the peripheral circuit. After removing seventh photoresist pattern 43, N-type and P-type impurities are ion-implanted to the resultant, and heat-treatment is performed for activating and diffusing the implanted ions via a conventional MOS transistor-forming process. Therefore, an EEPROM cell consisting of floating gate electrode 31A formed on first P-well 27, a control gate electrode 42 formed on floating gate electrode 31A, and a fourth source and drain regions 44d is formed. In the peripheral circuit region, a first MOS transistor (an first NMOS transistor) consisting of first gate electrode 39a formed on second P-well 27A, and first source and drain regions formed in the surface portions of second P-well 27A is formed. Also, on a second portion of semiconductor substrate 20 in the peripheral circuit region, a second MOS transistor (a second NMOS transistor) consisting of second gate electrode 39b and second source and drain regions 44a formed in the second surface portions of semiconductor substrate 20 in the peripheral circuit region, is formed. On second 15N-well 24A, a third MOS transistor (a PMOS transistor of the peripheral circuit) consisting of a third gate electrode 39c formed on second N-well 24A and a third source and drain regions 44c formed in the surface portions of second N-well, is formed. Thus, two NMOS transistors and one PMOS transistor of the peripheral circuit are formed in the peripheral circuit region.

Subsequent steps (not shown) such as a metallization process, a process for forming insulation interlayer, and a planarization process, are performed to thereby complete the EEPROM device of the present invention, in the same manner as in the case of a conventional memory device. Therefore, detailed descriptions thereof will be omitted.

Embodiment 2

Figure 13:
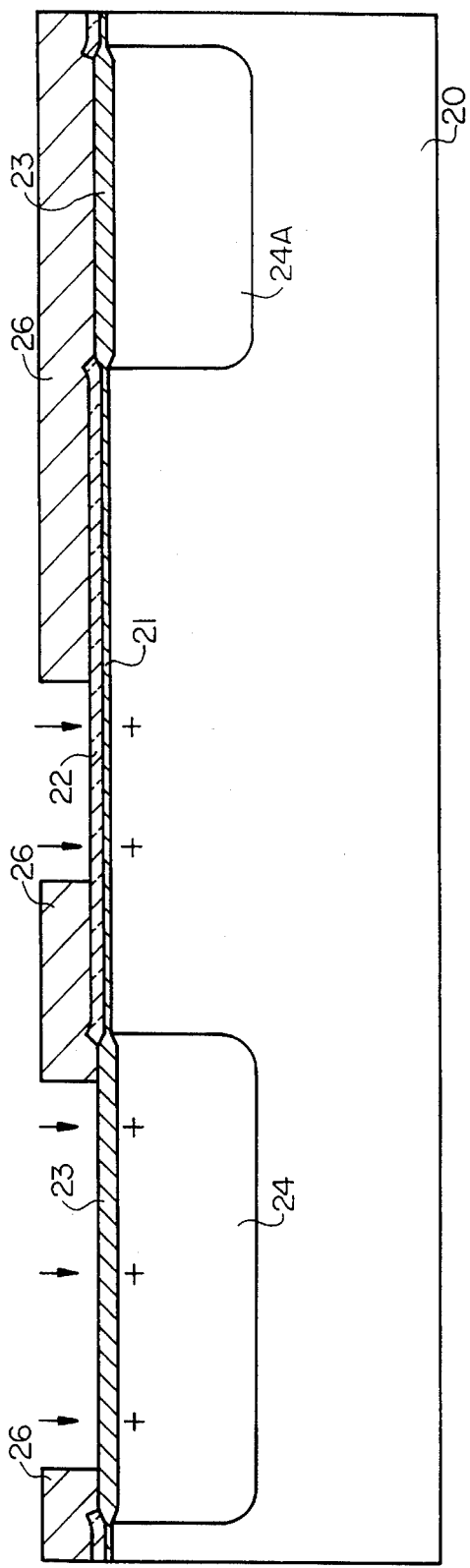
FIGS. 13 and 14 are sectional views illustrating a method for manufacturing a NAND-structured EEPROM device according to a second embodiment of the present invention.
Figure 14:
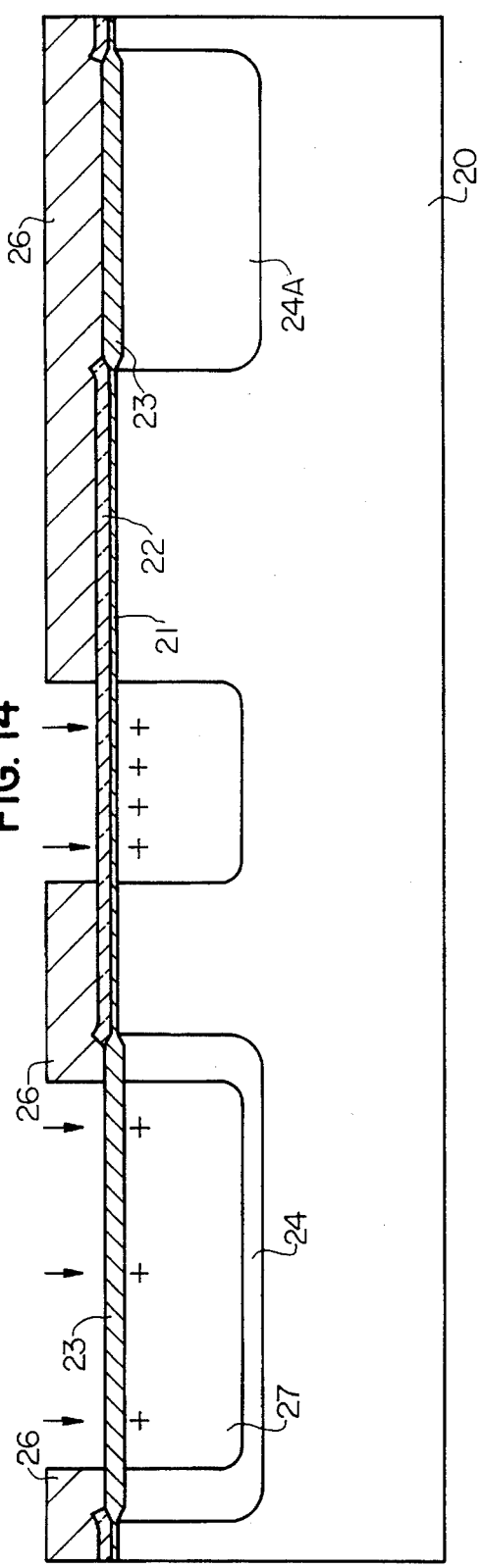

FIGS. 13 and 14 are sectional views illustrating a method for manufacturing a NAND-structured EEPROM device according to a second embodiment of the present invention.

FIG. 13 is a sectional view illustrating a step of firstly implanting a first conductivity type impurity.

The same procedure as shown in FIG. 4 of Embodiment 1 is performed. After forming second photoresist pattern 26 in the same manner as in Embodiment 1, boron is ion-implanted at a dosage of $1.5 \times 10^{13}$ atoms/cm$^2$ and at an acceleration energy such that the boron penetrates first and second oxide layers 21 and 23 and silicon nitride layer 22, for example, at an acceleration voltage of 240 KeV.

FIG. 14 is a sectional view illustrating a step of secondly implanting a first conductivity type impurity. After the step of FIG. 13, boron is ion-implanted at a dose of $0.5 \times 10^{13}$ and at an acceleration energy such that the boron penetrates silicon nitride layer 22 but not second oxide layer 23, i.e., at an acceleration voltage of 130 KeV. Thereafter, in the same manner as in Embodiment 1, after removing second photoresist pattern 26, a drive-in step is performed, to thus complete first (pocket) P-well 27 of the cell array area and second P-well 27A of the peripheral circuit region.

Thereafter, subsequent steps are performed in the same manner as described with respect to FIGS. 7 through 12 of Embodiment 1, so the detailed descriptions thereof omitted.

Embodiment 3

Figure 15:
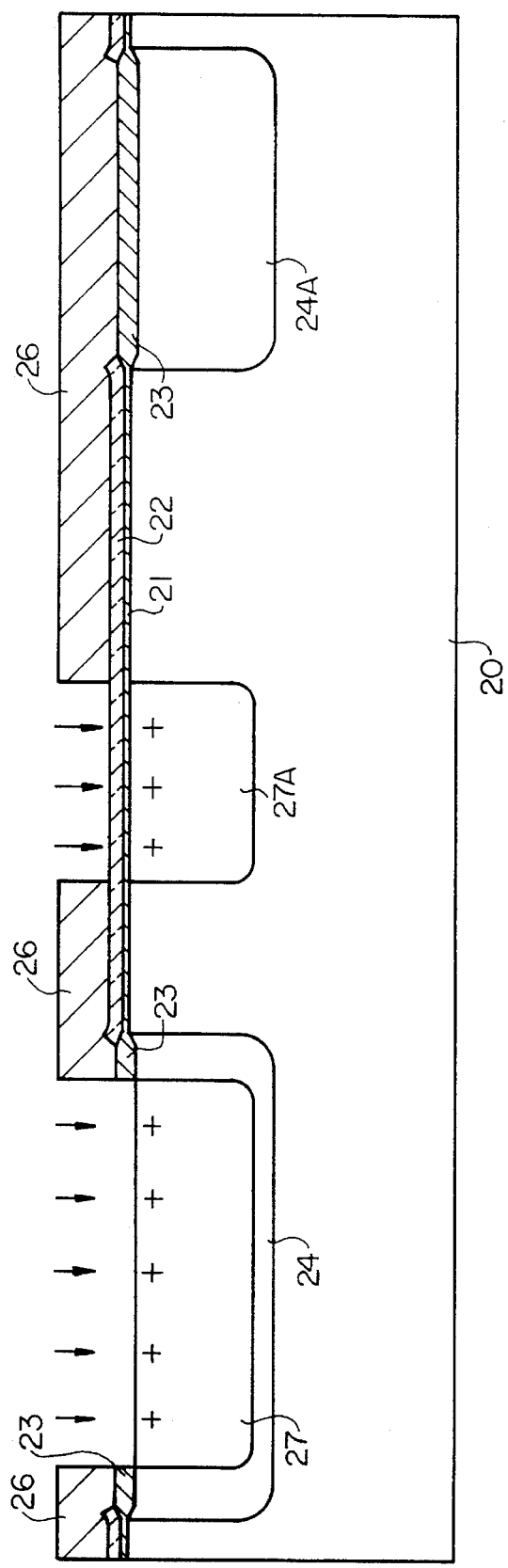
FIG. 15 is a sectional view illustrating a method for manufacturing a NAND-structured EEPROM device according to a third embodiment of the present invention.

FIG. 15 is a sectional view illustrating a method for manufacturing a NAND-structured EEPROM device according to a third embodiment of the present invention.

FIG. 15 is a sectional view illustrating a step of implanting a first conductivity type impurity. In Embodiments 1 and 2, the first conductivity type impurity is implanted via two implantation steps. However, in the present embodiment, the first conductivity type impurity is implanted just once.

After forming second photoresist pattern 26 and removing the exposed second oxide layer 23 by the wet-etching in the same manner as in Embodiment 1, for forming first P-well 27 and second P-well 27A, boron is implanted at a dose of $1.5 \times 10^{13}$ atoms/cm$^2$ and at an acceleration energy such that the boron penetrates silicon nitride layer 22, for example, at an acceleration voltage of 240 KeV. With changing the thickness of silicon nitride layer 22, the doped amount of the impurity (that is, boron) which forms second P-well 27A may be controlled.

Thereafter, the subsequent steps are performed in the same manner as in Embodiment 1 (i.e., those shown in FIGS. 7 through 12).

Embodiment 4

Figure 16:
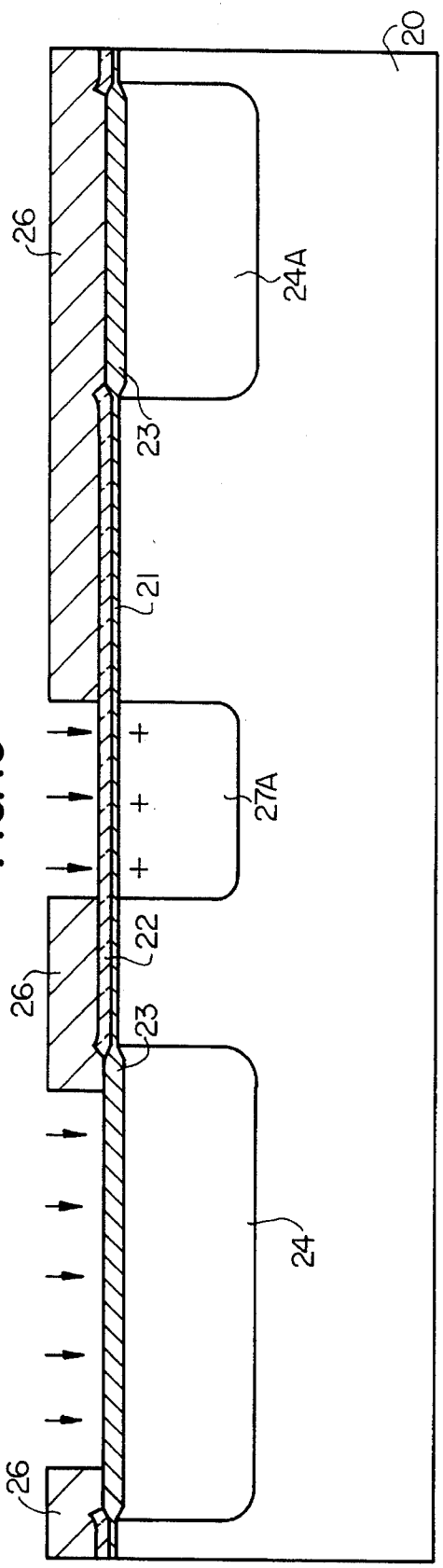
FIGS. 16 and 17 are sectional views illustrating a method for manufacturing a NAND-structured EEPROM device according to a fourth embodiment of the present invention.
Figure 17:
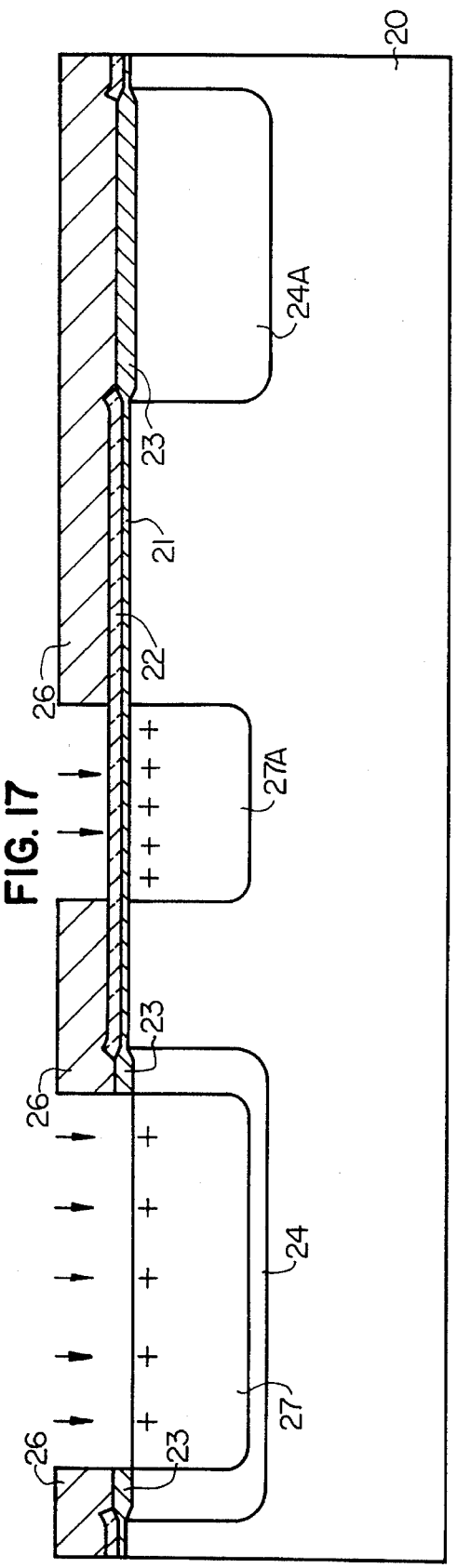

FIGS. 16 and 17 are sectional views illustrating a method for manufacturing a NAND-structured EEPROM device according to a fourth embodiment of the present invention.

FIG. 16 is a sectional view illustrating a step of firstly implanting a first conductivity type impurity. After performing the step of FIG. 4 of Embodiment 1, second photoresist pattern 26 is formed in the same manner as in Embodiment 1. Thereafter, boron is ion-implanted at a dosage of $1.5 \times 10^{13}$ atoms/cm$^2$ and at an acceleration energy such that boron penetrates silicon nitride layer 22 but not second oxide layer 23, for example, at an acceleration voltage of 240 KeV.

FIG. 17 is a sectional view illustrating a step of secondly implanting a first conductivity type impurity. After the step of FIG. 16, the exposed portion of second oxide layer 23 is removed by the wet-etching, and then boron is ion-implanted at a dosage of $1.0 \times 10^{13}$ and at an acceleration energy such that boron penetrates silicon nitride layer 22, for example, at an acceleration energy of 240 KeV. Thereafter, a drive-in step is performed in the same manner as in Embodiment 1, to thereby form first P-well 27 and second P-well 27A.

The subsequent steps are performed in the same manner as those of FIGS. 7 through 12. Accordingly, the detailed descriptions thereof are omitted.

Embodiment 5

Figure 18:
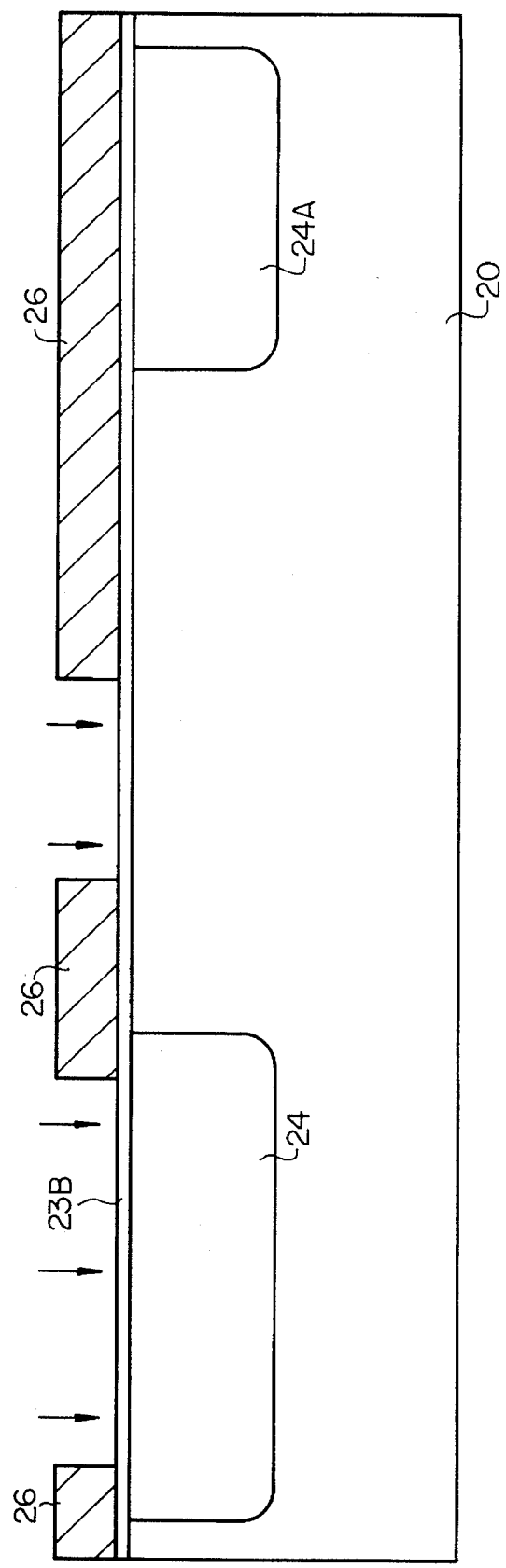
FIG. 18 is a sectional view illustrating a method for manufacturing a NAND-structured EEPROM device according to a fifth embodiment of the present invention.

FIG. 18 is a sectional view illustrating a method for manufacturing a NAND-structured EEPROM device according to a fifth embodiment of the present invention.

In the present embodiment, controlling the concentration of the impurity for forming first P-well 27 and second P-well 27A separately and independently, is unnecessary.

FIG. 18 is a sectional view illustrating a step of implanting a first conductivity type impurity. After performing the step of FIG. 4 of Embodiment 1, nitride layer 22 (which is used as an anti-oxidative layer) and first oxide layer 21 are removed by wet etching, thereby exposing the whole surface of semiconductor substrate 20. Thereafter, an oxide layer 23B is grown to a thickness of about 500 Å via a conventional thermal oxidation. Then, second photoresist pattern 26 is formed in the same manner as in Embodiment 1, to thereby expose the portions of oxide layer 23B where first P-well and second P-well are to be formed.

Next, boron is ion-implanted at a dosage of $1.5 \times 10^{13}$ and at an acceleration energy such that boron penetrates oxide 23B.

The subsequent steps are performed in the same manner as those of FIGS. 7 through 12. Accordingly, the detailed descriptions thereof are omitted.

The NAND-structured EEPROM device according to the present invention comprises EEPROM cells formed on a pocket P-well. The impurity concentration of the pocket P-well is controlled independently form the P-well formed in the peripheral circuit region. Therefore, an EEPROM device having two P-wells in the cell array region and the peripheral circuit peripheral circuit region of which the concentrations may controlled according to device characteristics and independently from each other, can be obtained.

According to one embodiment of the present invention, an NMOS transistor of the peripheral circuit region which is operated at a high voltage is formed directly on the P-type semiconductor substrate. Therefore, the resistance thereof against the high voltage is enhanced. Further, an NMOS transistor of the peripheral circuit region which is operated at Vcc, is formed on the P-well of the peripheral circuit region the characteristics of which are controlled independently from the P10 well of the cell array region. This enhances the punch-through characteristic.

Also, according to a method for manufacturing a NAND structured EEPROM memory device, using only a twice-performed photolithography process may separately and independently control the characteristics of the P-wells of the cell array region and the peripheral circuit region. Therefore, the characteristics of the P-wells are differentiated so that the transistor characteristic of the peripheral circuits can be differentiated.

Consequently, the present invention can provide a non-volatile semiconductor memory device having an excellent characteristic in spite of the shortened steps of the whole process.

While the present invention has been particularly shown and described with reference to particular embodiments thereof, it will be understood by those skilled in the art that various changes in form and details may be effected therein without departing from the spirit and scope of the invention as defined by the appended claims.

What is claimed is:

1. An EEPROM semiconductor memory device comprising:
    a semiconductor substrate having a first conductivity type, said semiconductor substrate being divided into a cell array region and a peripheral circuit region;
    a first impurity-doped region having said first conductivity type formed in a first surface portion of said semiconductor substrate in said cell array region;
    a second impurity-doped region having a second conductivity type formed in said first surface portion of said semiconductor substrate in said cell array region, said second impurity-doped region enclosing said first impurity-doped region;
    a memory cell comprising:
        a memory source region and a memory drain region formed on a surface portion of said first impurity-doped region, and
        a floating electrode formed on said first impurity-doped region and a control electrode formed on said floating electrode;
    a third impurity-doped region having said first conductivity type formed in a first surface portion in said peripheral circuit region of said semiconductor substrate;
    a first MOS transistor comprising:
        first source and drain regions formed in respective surface portions of said third impurity-doped region, and
        a first gate electrode formed on said third impurity-doped region; a second MOS transistor comprising:
        second source and drain regions formed directly in respective second surface portions in said peripheral circuit region of said semiconductor substrate, and
        a second gate electrode formed on said semiconductor substrate;
    a fourth impurity-doped region having said second conductivity type and being formed in a third surface portion in said peripheral circuit region of said semiconductor substrate; and
    a third MOS transistor comprising:
        third source and drain regions formed in respective surface portions of said fourth impurity-doped region, and
        a third gate electrode formed on said fourth impurity-doped region.

2. The EEPROM semiconductor memory device according to claim 1, wherein said first and second MOS transistors are NMOS transistors, and said third MOS transistor is a PMOS transistor.

3. The EEPROM semiconductor memory device according to claim 1, wherein a first gate insulating film of said second MOS transistor is thicker than a second gate insulating film of said first MOS transistor.

4. The EEPROM semiconductor memory device according to claim 1, wherein said second MOS transistor is formed between said first MOS transistor and said third MOS transistor.

5. The EEPROM semiconductor memory device according to claim 1, wherein a first impurity concentration of said first impurity-doped region is controlled independently from a second impurity concentration of said third impurity-doped region.

6. The EEPROM semiconductor memory device according to claim 1, wherein said first conductivity type is P-type and said second conductivity type is N-type.

7. An EEPROM semiconductor memory device comprising:
    a P-type semiconductor substrate which is divided into a cell array region and a peripheral circuit region;
    a first P-well formed in a surface portion in said cell array region of said semiconductor substrate;
    a first N-well formed in said surface portion in said cell array region of said semiconductor substrate, said first N-well enclosing said first P-well;
    a memory cell comprising:
        a memory source region and a memory drain region formed on a surface portion of said first P-well,
        a floating electrode formed on said first P-well, and
        a control electrode formed over said floating electrode;
    a second P-well formed in a first surface portion of said peripheral circuit region of said semiconductor substrate;
    a first NMOS transistor comprising:
        first source and drain regions formed in respective surface portions of said second P-well, and
        a first gate electrode formed on said second P-well;
    a second NMOS transistor comprising:
        second source and drain regions formed directly in a second surface portion of said peripheral circuit region of said semiconductor substrate, and
        a second gate electrode formed on said second surface portion of said peripheral circuit region of said semiconductor substrate;
    a second N-well formed in a third surface portion of said peripheral circuit region of said semiconductor substrate; and
    a PMOS transistor comprising:
        third source and drain regions formed in a surface portion of said second N-well, and
        a third gate electrode formed on said second N-well.

8. The EEPROM semiconductor memory device according to claim 7, wherein said first N-well and said second N-well are formed substantially simultaneously, and said first P-well and said second P-well are formed substantially independently.

9. The EEPROM semiconductor memory device according to claim 1, wherein said first impurity-doped region and said third impurity-doped region are formed substantially simultaneously, and said second impurity-doped region and said fourth impurity-doped region are formed substantially independently.

* * * * *